United States Patent
Standing

(10) Patent No.: US 9,642,289 B2
(45) Date of Patent: May 2, 2017

(54) POWER SUPPLY AND METHOD

(71) Applicant: Infineon Technologies Austria AG, Villach (AT)

(72) Inventor: Martin Standing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 622 days.

(21) Appl. No.: 14/031,720

(22) Filed: Sep. 19, 2013

(65) Prior Publication Data

US 2015/0078042 A1    Mar. 19, 2015

(51) Int. Cl.
G06F 1/00 (2006.01)
H05K 7/20 (2006.01)
H05K 1/02 (2006.01)

(52) U.S. Cl.
CPC ........... *H05K 7/209* (2013.01); *H05K 1/0206* (2013.01); *H05K 1/0209* (2013.01); *H05K 2201/10189* (2013.01)

(58) Field of Classification Search
CPC .......... H05K 7/209; H05K 7/20; H01L 29/66; H01L 29/66022; H01L 29/6603; H02M 7/00; G06F 1/00; G06F 1/18; F28F 13/00; F28F 1/00
USPC ............ 713/323; 363/37; 438/142; 361/704, 361/720, 717
See application file for complete search history.

(56) References Cited

U.S. PATENT DOCUMENTS

| | | | |
|---|---|---|---|
| 5,073,850 A | 12/1991 | Pace | |
| 5,804,952 A * | 9/1998 | Chen | H02M 3/28 323/255 |
| 5,898,569 A * | 4/1999 | Bhatia | G06F 1/203 165/80.2 |
| 6,452,093 B1 * | 9/2002 | Ishii | G06F 1/163 174/16.3 |
| 6,459,575 B1 * | 10/2002 | Esterberg | G06F 1/203 165/185 |
| 6,820,686 B2 | 11/2004 | Yang et al. | |
| 7,492,597 B2 | 2/2009 | Huang | |
| 7,863,770 B2 | 1/2011 | Lanni | |
| 8,169,781 B2 | 5/2012 | Lu | |
| 2004/0032756 A1 | 2/2004 | Van Den Bossche | |
| 2004/0264143 A1 | 12/2004 | Chen et al. | |
| 2006/0076124 A1 * | 4/2006 | Sharifipour | H05K 7/20463 165/104.15 |
| 2010/0078807 A1 * | 4/2010 | Schulz | H01L 23/34 257/713 |

(Continued)

FOREIGN PATENT DOCUMENTS

WO    0239567 A2    5/2002

*Primary Examiner* — Thomas Lee
*Assistant Examiner* — Aaron J Browne
(74) *Attorney, Agent, or Firm* — Murphy, Bilak & Homiller, PLLC

(57) ABSTRACT

A power supply includes a plurality of electronic components including one or more of a rectifier and a switching transistor, an input port configured to receive electrical energy from a power source and a circuit board comprising a cavity. At least one of the rectifier and the switching transistor is embedded in the cavity. The cavity is arranged proximal to the input port such that at least a portion of thermal energy generated by one or more of the rectifier and the switching transistor is dissipated from the power supply by way of the input port.

21 Claims, 12 Drawing Sheets

(56) References Cited

U.S. PATENT DOCUMENTS

| | | | |
|---|---|---|---|
| 2011/0084607 A1* | 4/2011 | Hopper | H05B 33/0803 |
| | | | 315/53 |
| 2011/0116246 A1 | 5/2011 | Lee et al. | |
| 2011/0163434 A1 | 7/2011 | Bell et al. | |
| 2012/0020135 A1 | 1/2012 | McCune | |
| 2012/0217626 A1* | 8/2012 | Sakai | H01L 21/4825 |
| | | | 257/666 |
| 2013/0069113 A1 | 3/2013 | Yamada | |
| 2013/0201629 A1* | 8/2013 | Schultz | H05K 7/20445 |
| | | | 361/704 |

* cited by examiner

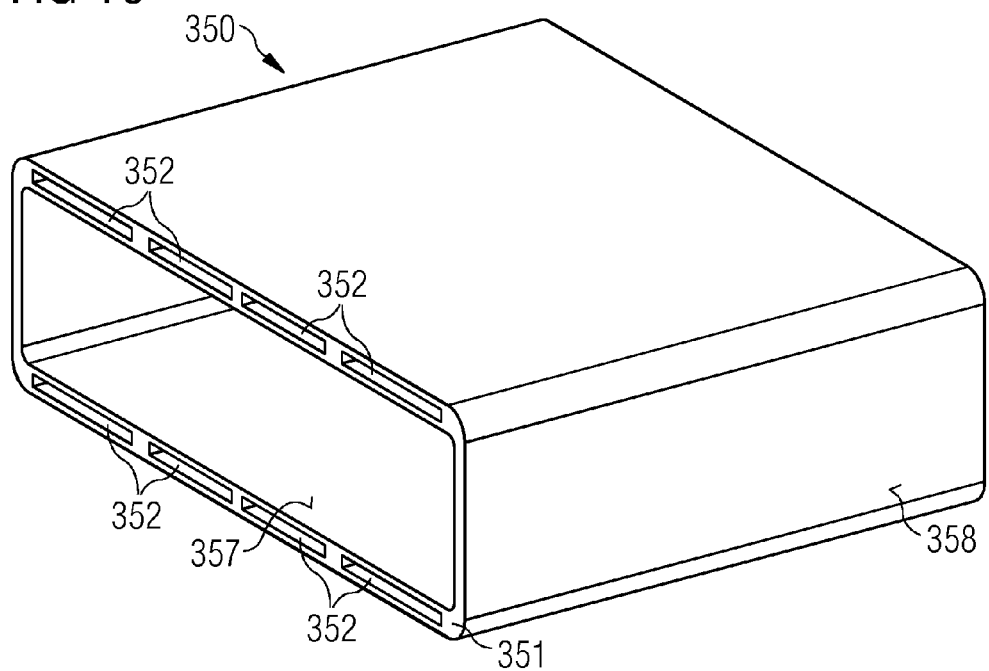
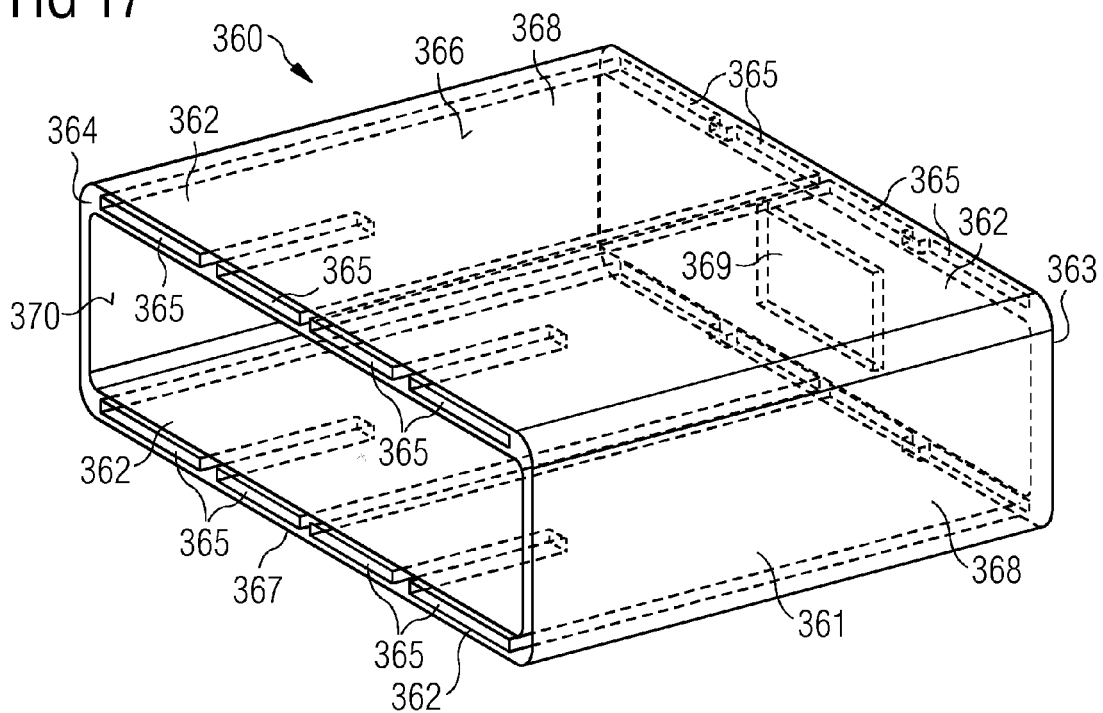

ND METHOD

POWER SUPPLY AND METHOD

BACKGROUND

A power supply may be used within or with various electronic apparatus for providing electric power. A power supply may convert an alternating current (AC) source into a direct current (DC) source required by one or more electronic devices. For example, a power supply may be used for converting a mains alternating current into a direct current source suitable for a laptop computer or mobile telephone. Such power supplies, particularly when used external to the electronic device, may also be called adapters, chargers, or power converters.

The electronic components within the power supply may generate thermal energy during operation. In order to avoid the electronic components from becoming undesirably hot, the power supply may include heat dissipation devices. One type of heat dissipation device is a heatsink which may be positioned between the heat generating electronic components and the casing of the power supply so as to transfer the heat to the casing. However, it is also desirable that the casing does not exceed a desired predetermined temperature.

To prevent the casing becoming undesirably hot, one or more further heat dissipation plates may be provided between the heatsink and the casing, or an additional fan may be provided to force currents of air to carry the heat from the heatsink to the outside through vents provided in the casing.

It is, however, generally desirable to reduce the size of electronic apparatus, including power supplies. However, reducing the size of the power supply reduces the space available for additional heat dissipating plates, fans etc. Therefore, a power supply which has good heat dissipation and may have a reduced size is desirable.

SUMMARY

A power supply is provided that includes a plurality of electronic components comprising one or more of a rectifier and a switching transistor, an input port configured to receive electrical energy from a power source and a circuit board comprising a cavity. At least one of the rectifier and the switching transistor is embedded in the cavity. The cavity is arranged proximal to the input port such that at least a portion of thermal energy generated by one or more of the rectifier and the switching transistor is dissipated from the power supply by way of the input port.

A method is provided that includes receiving, at an input port of a power supply, electrical energy from a power source, supplying the received electrical energy to one or more of a rectifier and a switching transistor, wherein one or more of the rectifier and the switching transistor is embedded in a cavity, and the cavity is arranged proximal to the input port, and dissipating at least a portion of thermal energy generated by one or more of the rectifier and the switching transistor from the power supply by way of the input port.

A power supply is provided that includes means for receiving, at an input port of a power supply, electrical energy from a power source, means for supplying the received electrical energy to one or more of a rectifier and a switching transistor, wherein one or more of the rectifier and the switching transistor is embedded in the cavity, and wherein the cavity is arranged proximal to the input port and means for dissipating at least a portion of thermal energy generated by one or more of the rectifier and the switching transistor from the power supply by way of the input port.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 16 illustrates a perspective cross-sectional view of a housing for a power supply.

FIG. 17 illustrates a perspective cross-sectional view of a housing for a power supply.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

Figure 1A:
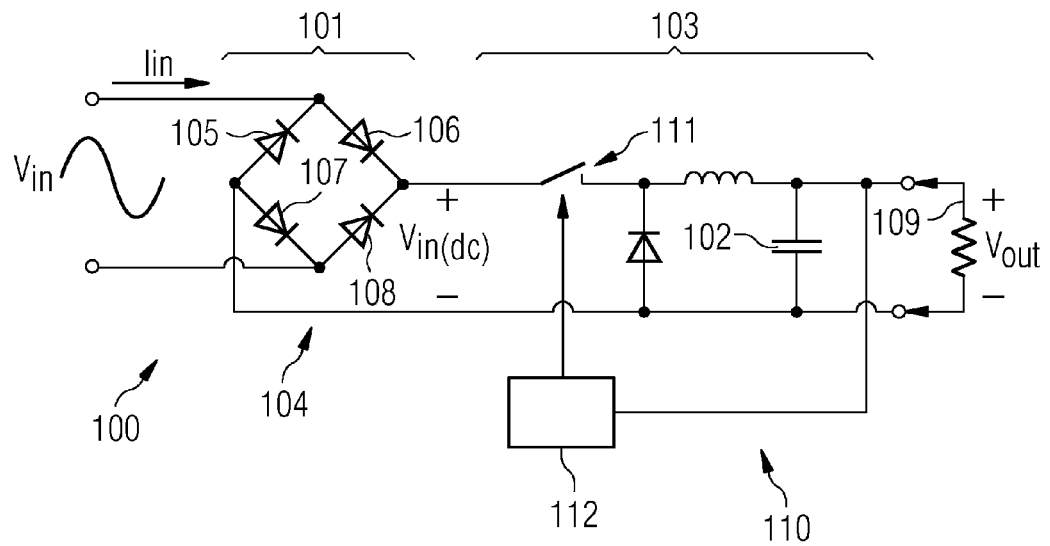
FIG. 1a illustrates an exemplary circuit diagram of a power supply.

FIG. 1a illustrates a circuit diagram of a power supply 100 for converting alternating current to direct current. The power supply 100 includes a primary side circuit 101, an inductor 102 and a secondary side circuit 103. The primary side circuit 101 receives alternating current, for example provided by an AC mains supply, by way of an input port. The AC to DC rectification is, in this embodiment, accomplished using a bridge rectifier 104 including four diodes 105, 106, 107, 108. The bridge rectifier 104 converts the positive and negative half cycles of the AC input voltage $V_{in}$ to a full wave rectified wave form of constant polarity. To produce the desired steady DC output voltage $V_{out}$ across a load 109 coupled to the output of the power supply 100, the rectified wave form is filtered by smoothing circuit coupled to the output of the bridge rectifier 104.

The smoothing circuit functions to maintain the DC output voltage near the peak voltage during the low portions of the AC input voltage $V_{in}$. Some amount of AC ripple is superimposed on the DC output $V_{out}$ depending on the smoothing circuit used. The smoothing circuit may be a smoothing capacitor coupled to the output of the bridge rectifier, for example. Additional filtering may also be employed to reduce the ripple to an acceptable level.

The DC output voltage $V_{out}$ produced by the primary side has a peak voltage $V_{peak}$ near to that of the AC input voltage $V_{in}$. However, many applications may require much lower voltage. For example, many devices require a DC voltage of 12 V DC, or even less, whereas the AC voltage $V_{in}$ may be 230 V for residential AC mains in some countries.

To lower the DC voltage to the required level, a stepdown transformer or DC-DC converter 110 may be used in the secondary side circuit. A DC-DC converter 110 may include a switch 111, such as a transistor, a diode, an inductor, a filter capacitor and a pulse width modulator (PWM) control 112. The PWM control 112 controls the opening and closing of the switch 111 at a fixed frequency that is much higher than the 50 Hz frequency of the AC mains, typically the PWM control controls the opening and enclosing of the switch at a frequency of greater than 1 kHz.

When the switch 111 is turned on, current flows through the switch 111, the inductor, into the filter capacitor and the load 109. The increasing current causes the magnetic field of the inductor to build up an energy to be stored in the inductors magnetic field. When the switch is turned off, the voltage drop across the inductor quickly reverses polarity and the energy stored by the inductor is used as a current source for the load. The DC output voltage $V_{out}$ is determined by the proportion of time the switch is on ($T_{on}$) in a period T, where T is 1/f. More specifically, $V_{out}$ is equal to $DV_{in}(DC)$, where $D=T_{on}/T$ is known as the duty cycle and $V_{in}(DC)$ is the source DC input voltage provided at the output of the bridge rectifier 104. The PWM controller is configured in a feedback path, allowing it to regulate the DC output voltage $V_{out}$ by modulating the duty cycle D.

In some embodiments, the power supply may include several outputs, each providing a different DC voltage, or differing DC voltages may be provided single output.

Heat is generated by various components used in the primary side circuit 101 and, typically to a lesser extent, by components of the secondary side circuit 103. The components of the power supply 100 are typically enclosed in a casing or housing which may become hot due to the generation of heat by these components within the casing.

However, the circuit diagram of the power supply is not limited to that illustrated in FIG. 1a and may include differing forms of circuitry.

Figure 1B:
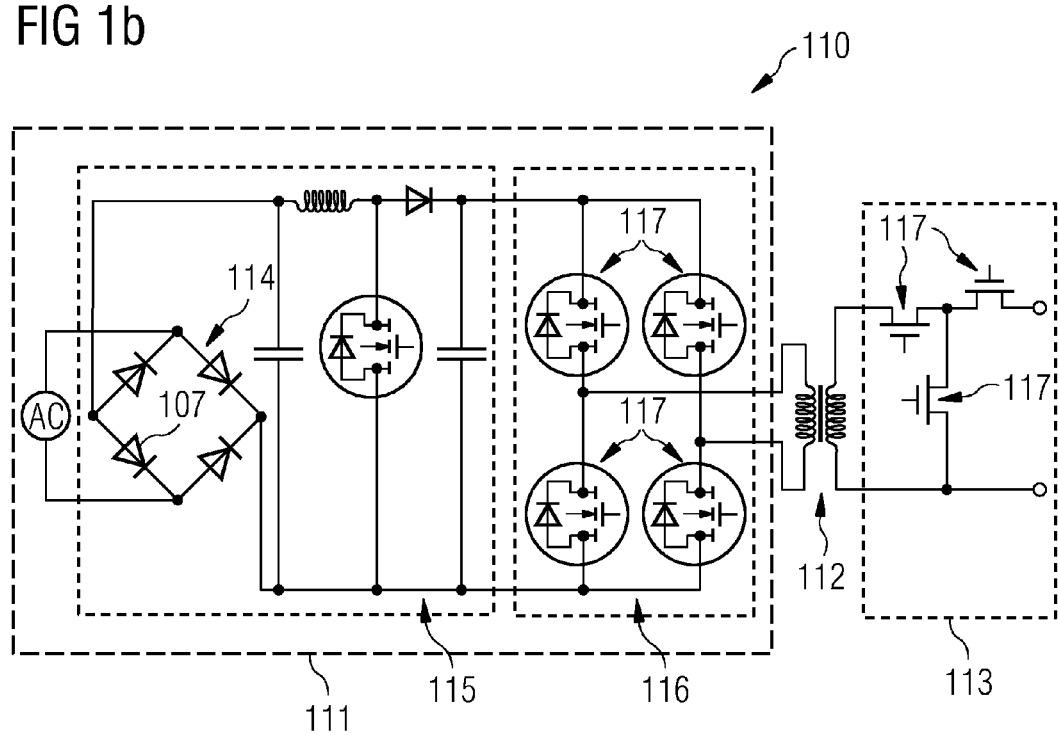
FIG. 1b illustrates an exemplary circuit diagram of a power supply.

FIG. 1b illustrates a circuit diagram of a further power supply 110 for converting alternating current to direct current. The power supply 110 includes a primary side circuit 111, a transformer 112 and a secondary side circuit 113. The primary side circuit 111 receives alternating current, for example from an AC mains supply. The primary side circuit 111 includes a bridge rectifier 114, a power correction factor circuit 115 and a full bridge 116 including four transistors 117. The transistors may be silicon-based MOSFET devices or gallium nitride-based high electron mobility transistors (HEMT), for example. The secondary side circuit 111 includes three further transistors 177.

However, the power supplies described in the following description are not limited to having one of the circuits illustrated in FIG. 1a or FIG. 1b. These circuit diagrams are merely examples of circuits which may be provided using one or more features of one or more of the power supplies described below.

Figure 2A:
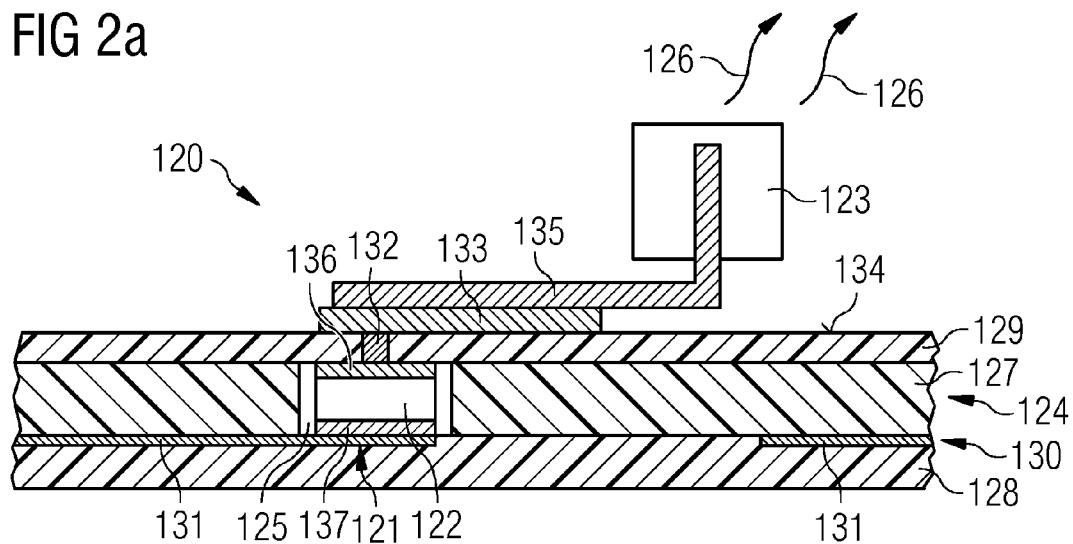
FIG. 2a illustrates a cross-section of a portion of a power supply.

FIG. 2a illustrates a schematic cross-sectional view of a portion of a power supply 120, in particular, a portion of a primary side of an AC/DC converter. The power supply 120 may have a basic circuit layout as illustrated in FIG. 1. However, the components and circuitry used to provide AC to DC conversion is not limited to the circuit layout illustrated in FIG. 1 may differ.

The power supply 120 includes one or more semiconductor dice 121 including one or more of a rectifier and a switching transistor. The rectifier may be a diode or a switching transistor such as a field effect transistor. The rectifier may also be a rectifying circuit comprising a plurality of components. In one embodiment, the rectifier is a bridge rectifying circuit including four diodes. The switching transistor may be a silicon-based semiconductor transistor such as a MOSFET (Metal Oxide Semiconductor Field Effect Transistor) or an IGBT (Insulated Gate Bipolar Transistor). The switching transistor may also comprise a compound semiconductor and may be a Group III-nitride transistor such as a GaN-based HEMT (High Electron Mobility Transistor).

In FIG. 2a, the illustrated semiconductor die 121 is a silicon diode 122 which forms part of a bridge rectifier including four diodes. The power supply 120 further includes an input port 123, such as a socket, a plug or a cable, configured to receive electrical energy from a power source, for example an AC source. The input port may include a socket, a lead or a plug, for example.

The power supply 120 includes a circuit board 124 including a cavity 125. The diode 122 is embedded in the cavity 125. The cavity 125 is arranged proximal to the input port 123 such that at least a portion of the thermal energy generated by the diode 122 is dissipated from the power supply 120 by way of the input port 123 as is schematically illustrated in FIG. 2a by arrows 126.

In the embodiment illustrated in FIG. 2a, the diode 122 is one of four diodes configured to provide a bridge rectifier for rectifying an AC voltage received by the input port 123 into a full wave rectified wave form of constant polarity. The input port 123 is electrically coupled to two of the diodes of the bridge rectifier.

The circuit board 124 is a multilayer circuit board in the embodiment illustrated in FIG. 2 including a first non-conductive core layer 127 including a nonconductive material such as glass-fibre reinforced epoxy commonly known as FR4. The cavity 125 is positioned in the first core layer 127 such that it extends through the thickness of the first core layer 127. The diode 122 has a height which is approximately that of the thickness of the core layer 127. The base of the cavity 125 is formed by a second core layer 128 and the cavity is capped by a third core layer 129.

The circuit board 124 further includes an electrically conductive redistribution structure including a conductive layer 130 including electrically conductive traces 131 positioned between the first core layer 127 and the second core layer 128 and a conductive via 132 positioned in the third core layer 129. The conductive via 132 extends between the diode 122 and a conductive contact pad 133 positioned on the upper surface 134 of the circuit board 124. A conductive portion of the input port 123 may be mounted on the contact pad 133 to electrically couple the input port 123 to the circuit board 124.

The diode 122 is a vertical device and has a first electrode 136 on an upper surface and a second electrode 137 on a lower surface. The first electrode 136 is coupled to the contact pad 133 and the second electrode 137 is mounted on, and coupled with, the conductive trace 131 of the circuit board 124.

The diode 122 is arranged proximal to the input port 123 so that heat generated by the diode 122 can be thermally dissipated by means of the conductive via 132, contact pad 133 and input port 123. The input port 123 may include a conductive connector 135 which is coupled between the circuit board 124 and the power source. The thermal energy may be dissipated into this connector and from there into the power source coupled to the input port 123 and/or into the surrounding environment.

As discussed above, the power supply includes four diodes 122 configured to form a bridge rectifying circuit. Each of the four diodes 122 may be embedded in the circuit board 124. Each of the four diodes 122 may be arranged in a separate discrete cavity or, two or more of the four diodes 122 may be arranged in a single common cavity within the circuit board 124. The four diodes 122 may be arranged in one or more cavities arranged in a single layer of the circuit board 124, for example in the first core layer 127. The diodes 122 may, however, be arranged in two or more differing core layers of the circuit board 124.

If a switching transistor is used in addition to the bridge rectifier or in place of one of the diodes, the switching transistor may also be mounted in a cavity in one of the core layers of the circuit board.

The semiconductor dice 121, for example a diode 122, may be positioned as a discrete component within the cavity 125 in the circuit board 124. The cavity may be arranged entirely within the circuit board or may be arranged in an outer core layer of the circuit board. The volume around the semiconductor die or dice may be filled, for example with an epoxy resin or adhesive or filler.

Other arrangements of the conductive via 132 are possible. For example, a conductive via may be provided in addition or in place of the conductive via 132 that extends from a lower surface of one or more of the semiconductor devices 121 to the underlying layer of the circuit board.

Figure 2B:
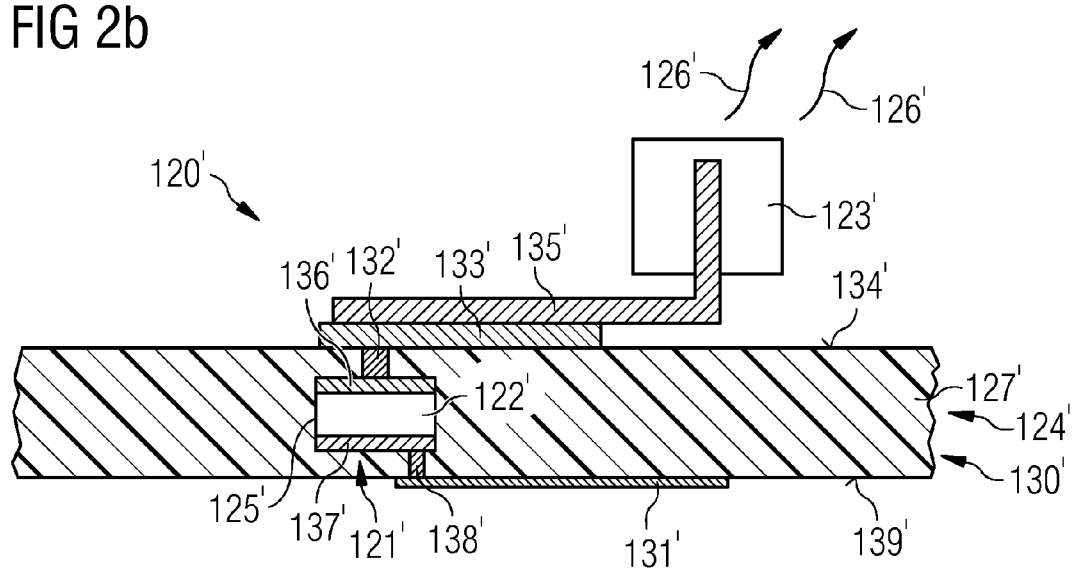
FIG. 2b illustrates a cross-section of a portion of a power supply.

FIG. 2b illustrates a schematic cross-sectional view of a portion of a power supply 120' and, in particular, a portion of a primary side circuit of an AC/DC converter. Similar to the embodiment illustrated in FIG. 2a, the power supply 120' includes one or more semiconductor dice 121' and, in particular, four diodes 122' which form a bridge rectifying circuit. One of the diodes 122' is illustrated in the cross-sectional view of FIG. 2b. The power supply 120' also includes an input port 123' which is coupled to a circuit board 124' by an inner connector 135'.

The power supply 120' illustrated in FIG. 2b differs from that illustrated in FIG. 2a in the form of the circuit board 124'. The circuit board 124' includes a single core layer 127'. The semiconductor dice 121' are embedded entirely within the single core layer 127'. In addition to the conductive via 132' which extends form the first electrode 136' positioned on the upper surface of the diode 122' to the upper surface 134' of the core layer 127', a second conductive via 138' extends from the second electrode 137' positioned on the lower surface of the diode 122' to the lower surface 139' of the single core 127'. The redistribution structure of the circuit board 124' includes conductive traces 133' on the upper surface 134' of the core layer 127' and conductive traces 131' on the lower surface 139' of the core layer 127' in addition to the conductive vias 132' and 138'.

In portions of the circuit board 124' not illustrated in the cross-sectional view of FIG. 2b, the circuit board 124' also includes conductive vias which extend through the entire thickness of the single core layer 127'.

The semiconductor diode 122' can be considered to be embedded in a cavity 125' which is completely filled by the diode 122'. In this embodiment, the cavity 125' does not include empty regions or regions filled with an additional compound which surrounds the diode 122'.

In some embodiments, one or more of the semiconductor dice 121 may be provided in the form of a submodule or insert which includes packaging of the one or more semiconductor dice and, in some embodiments, also a redistribution structure.

Figure 3A:
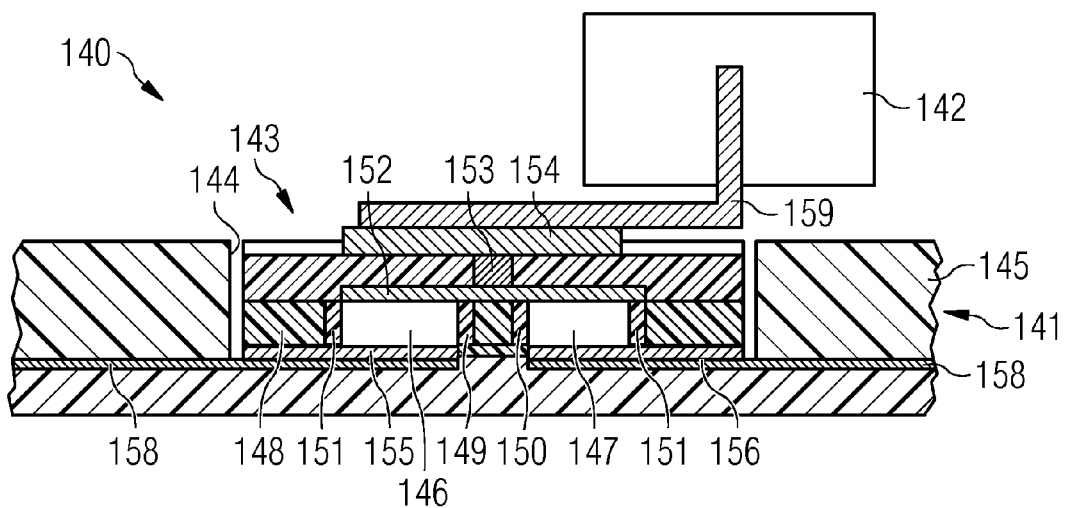
FIG. 3a illustrates a cross-section of a portion of a power supply.

FIG. 3a illustrates a schematic cross-section of a portion of a primary side of a power supply 140 for converting an AC input voltage to a DC output voltage. The power supply 140 includes a circuit board 141, an input port 142 for receiving an AC voltage and a submodule 143 positioned in a cavity 144 positioned in a core layer 145 of the circuit board 141. The submodule 143 includes a bridge rectifying circuit including four diodes, of which two diodes 146 and 147 are illustrated in the cross-sectional view of FIG. 3a.

The submodule 143 includes a non-conductive core layer 148 which may include a glass-fibre reinforced epoxy resin. Two cavities 149, 150 are positioned in the core layer 148 adjacent one another so that they extend through the thickness of the core layer 148. The core layer 148 further includes two further cavities, which are not illustrated in the cross-sectional view of FIG. 3a. One of the further two non-illustrated diodes is positioned in each of these cavities.

The diode 146 is supported in the cavity 149 by a retainer 151 in the form of epoxy resin which at least bridges the gap between the side faces of the diode 146 and the inner side faces of the cavity 149. The retainer 151 may fill these gaps and may slightly overlap the peripheral regions of the diode 146 and cavity 149 in order to provide additional mechanical support for the diode 146 within the cavity 149. The diode 147 is also supported in the cavity 150 by a retainer 151.

The two diodes 146, 147 are electrically coupled to one another by a conductive trace 152 extending between the upper surface of each of the diodes 146, 147. The conductive trace 152 provides a node of the bridge rectifying circuit and is electrically coupled to the input port 142 by an electrically conductive via 153 and to contact area 154 of the submodule 143. In some embodiments, the via 153 may be omitted so that the contact area 154 of the submodule 143 is arranged in the same plane as the conductive trace 152 which electrically connects the two diodes 146 and 147 to one another.

The submodule 143 further includes conductive traces 155 and 156 on its rear side which may be used to electrically couple each of diodes 146, 147, respectively, to a further diode. These electrically conductive traces 156, 157 provide contact pads on the lower side of the module 143. The contact pads may be electrically coupled to further conductive traces 155 of the circuit board 141 by mounting them directly on the conductive traces of the circuit board 141. The contact pads of the submodule 143 may be electrically insulated from the circuit board 141 by mounting the submodule 143 on a nonconductive core layer, for example.

The contact pads and conductive traces 152, 155, 156 of the submodule 143 may include copper. The conductive traces of the circuit board 141 may include copper. The non-conductive core layer 148 of the submodule 143 may include the same non-conductive material as the core layer 127 of the circuit board 124, for example a glass-fibre reinforced epoxy resin. In some embodiments, the non-conductive material of the core layer 148 of the submodule 143 may differ from the nonconductive material of the core layer or layers of the circuit board 124.

The submodule 143 is positioned proximal to the input port 142 in order that at least a portion of the thermal energy generated by the submodule 143 may be dissipated from the power supply by way of the input port 142. The submodule 143 may be positioned at least in part directly underneath the input port 142 and directly underneath the connector 159 between the submodule 143 and the input port 142. The connector 159 is mounted on the conductive trace 154 of the submodule 143.

Figure 3B:
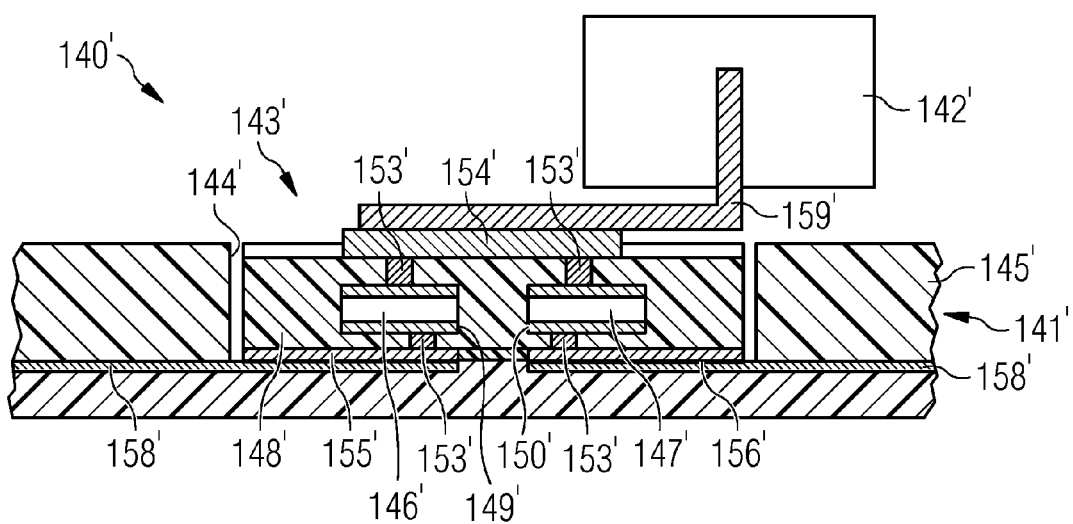
FIG. 3b illustrates a cross-section of a portion of a power supply.

FIG. 3b illustrates a schematic cross-section of a portion of a primary side of a power supply 140' for converting an AC input voltage to a DC output voltage. Similar to the power supply 140 illustrated in FIG. 3a, the power supply 140' includes a circuit board 141', an input port 142' for receiving an AC voltage and a submodule 143' positioned in a cavity 144' in a core layer 145' of the circuit board 141'. The submodule 143' includes a bridge rectifying circuit with four diodes of which two diodes 146' and 147' can be seen in the cross-sectional view of FIG. 3b.

The power supply 140' illustrated in FIG. 3b differs from that illustrated in FIG. 3a in the arrangement of the sub-module 143'. The submodule 143' includes only a single core layer 148'. The diodes 146', 147' as well as the two further diodes not seen in the cross-sectional view of FIG. 3b are embedded within the body of the core layer 148' such that they are enclosed on all sides by the material of the core layer 148'.

The redistribution structure of the submodule 143' includes conductive vias 153' extending from the upper surface of the diodes 146', 147' to the upper surface of the core layer 148' and conductive vias 153 extending from the lower surface of the diodes 146', 147' to the lower surface of the core layer 148'.

The redistribution structure also includes conductive traces 154' which are positioned on the upper surface of the core layer 148' and conductive traces 155' and 156' which are positioned on the lower surface of the core layer 148'. In this embodiment, the two diodes 146', 147' are electrically coupled to one another by a conductive trace 154' positioned on the upper surface of the submodule 143'. The submodule 143' also includes a conductive via extending from the upper surface to the lower surface in a portion of the module not illustrated in the cross-sectional view of FIG. 3b.

The submodule 143' is mounted in a cavity 144' of the circuit board 141' and is mounted on conductive traces 158' of the circuit board 141' in a similar manner to that described in connection with FIG. 3a.

The diode 146' can be considered to be mounted in a cavity 149' which is positioned entirely within the core layer 148' and which is entirely filled with the diode 146'. Similarly, the diode 147' can be considered to be mounted in a cavity 150' which is positioned entirely within the core layer 148' and which is entirely filled with the diode 147'.

The lateral arrangement of the embedded semiconductor dice in the power supply may be selected to assist thermal dissipation. An arrangement is illustrated in the three-dimensional perspective view of a power supply 160 of FIG. 4 and in the top view of FIG. 5.

The power supply 160 includes a primary side circuit 161, a secondary side circuit 162 and a transformer 163. The transformer 163 is arranged between the primary side circuit 161 and the secondary side circuit 162. The power supply 160 further includes an input port 164, which in the illustrated embodiment, is configured to as a socket to accept a connector from, for example, a cable and an output port 165 including a socket, for example the USB socket.

The primary side circuit 161 includes a bridge rectifying circuit 166 and at least one transistor 167 which are arranged proximal to the input port 164 and embedded in a first embedding region 175 in the circuit board 168 of the power supply 160. The first embedding region 175 is arranged underneath the input port 164. The further components of the primary side circuit 161, such as planar choke input filters 169 and capacitors 170 are also arranged between the transformer 163 and the input port 164. The further components may be arranged adjacent the first embedding region 175 and may be embedded in the circuit board 168 or may be mounted on the upper surface of the circuit board 168. The transformer 163 has a planar configuration and is also mounted in a cavity of the circuit board 168 arranged between the primary side circuit 161 and the secondary side circuit 162.

In the secondary side circuit 162, at least one secondary side transistor 173 is embedded in a second embedding region 176 within the circuit board 168 and is positioned proximal the output port 165. The second embedding region 176 is positioned underneath the output port 165 in this embodiment. In this embodiment, the secondary side transistor 173 is arranged at least partially underneath the output port 165. Output capacitors 171 and a planar inductor 172 are arranged adjacent the output port 165 and the second embedding region 175. The components of the secondary side circuit 162 are arranged between the transformer 163 and the output port 165.

By embedding the bridge rectifier 166, primary side transistor 167, secondary side transistor 173 and transformer 163 within the circuit board 168 of the power supply 160, the overall dimensions and, in particular, the height of the power supply 160 may be reduced over an arrangement in which each of these electronic components is provided in a separate package and/or combined into one or more submodules which are mounted on the upper surface of the circuit board 168.

Heat may be dissipated from heat generating components within the power supply 160, such as the bridge rectifier 166, the primary side transistor 167 and, to a lesser extent, the secondary side transistor 173 and planar transformer 163. The arrangement of these components within the power supply 160 may be used to assist heat dissipation. For example, the bridge rectifier 166 and the primary side transistor 167 are positioned proximal to the input port 164 so that heat may be dissipated by way of the input port 164 and, in particular, electrically conductive metal portions of the input port 164 and into a further connector which may be attached to the input port 164.

For example, in the illustrated embodiment, the input port 164 is a socket including two metal pins 174 providing an electrical connection between the external cable and the circuit board 168. Heat may be dissipated by these pins 174 from the bridge rectifier 166 and from the primary side transistor 167 outside of the power supply 160 and into the further connector, for example cable, inserted into the input port 164.

Similarly, by arranging the secondary side transistor 173 proximal to the output port 165 on the opposing end of the circuit board 168 thermal energy generated by the components of the secondary side circuit 162 is encouraged to be dissipated by way of the output port 165 and, in particular, by way of metallic portions of the output port 165.

The secondary side circuit 162 may provide a DC-DC converter for converting the voltage output from the bridge rectifier 166 to a different DC voltage. Typically, the voltage output from the bridge rectifier 166 is higher than that required for the device or device is attached to the output port 165. For example, the voltage output by the bridge rectifier 166 may be 230 V which corresponds to the voltage of residential AC mains supply received at the input port 164. The device to be attached to the output port 165 may, however, require a lower voltage of 12 V or less, for example 3 V.

Figure 4:
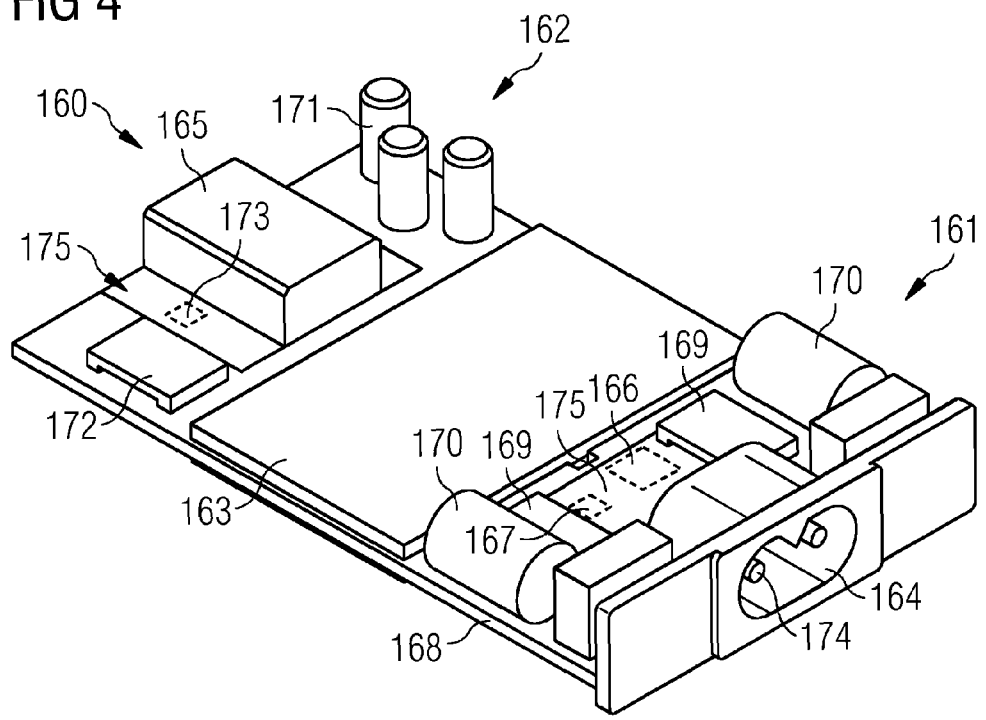
FIG. 4 illustrates a three-dimensional perspective view of a power supply.
Figure 5:
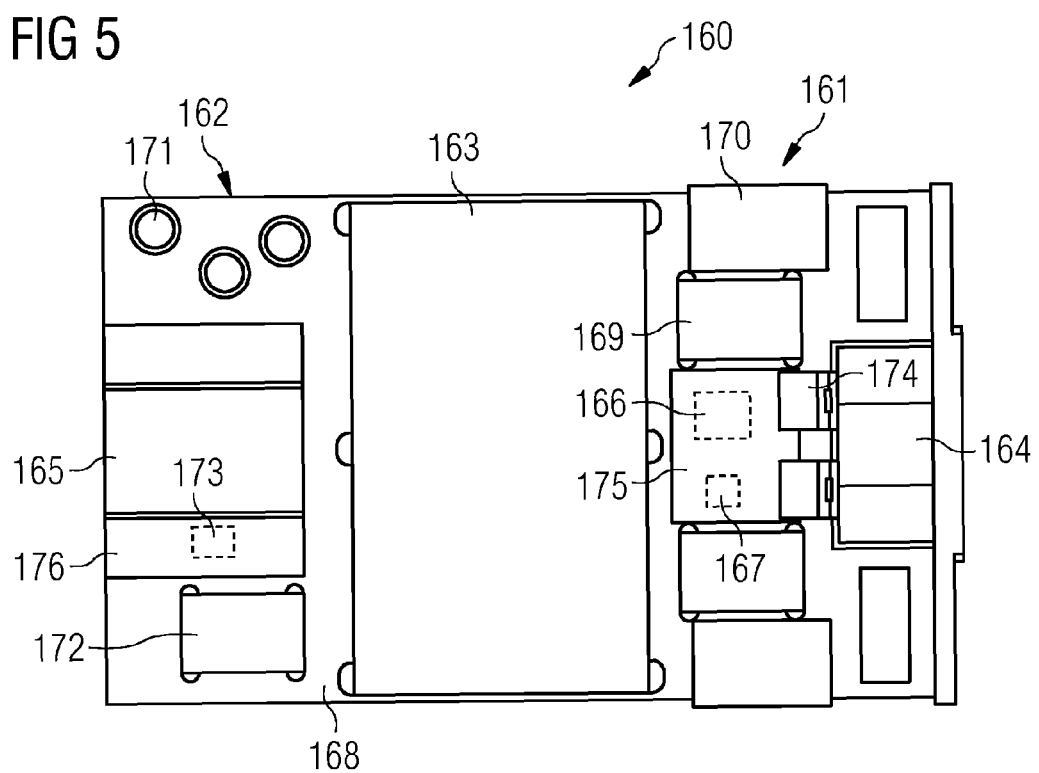
FIG. 5 illustrates a top view of a power supply.

The power supply illustrated in FIGS. 4 and 5 has an input port 164 and output port 165 which are adapted to detachably receive a further connector. However, the power supply 160 may include an input port 164 which is hardwired to a power supply and/or the output port 165 may be hardwired to a device receiving the converted power. For example, if the power supply 160 is mounted within the electronic apparatus, the output may be hardwired to the devices to be supplied with the DC voltage whereas the input port 164 may be detachably attachable to a further connector providing an AC voltage to the power supply 160.

Figure 6:
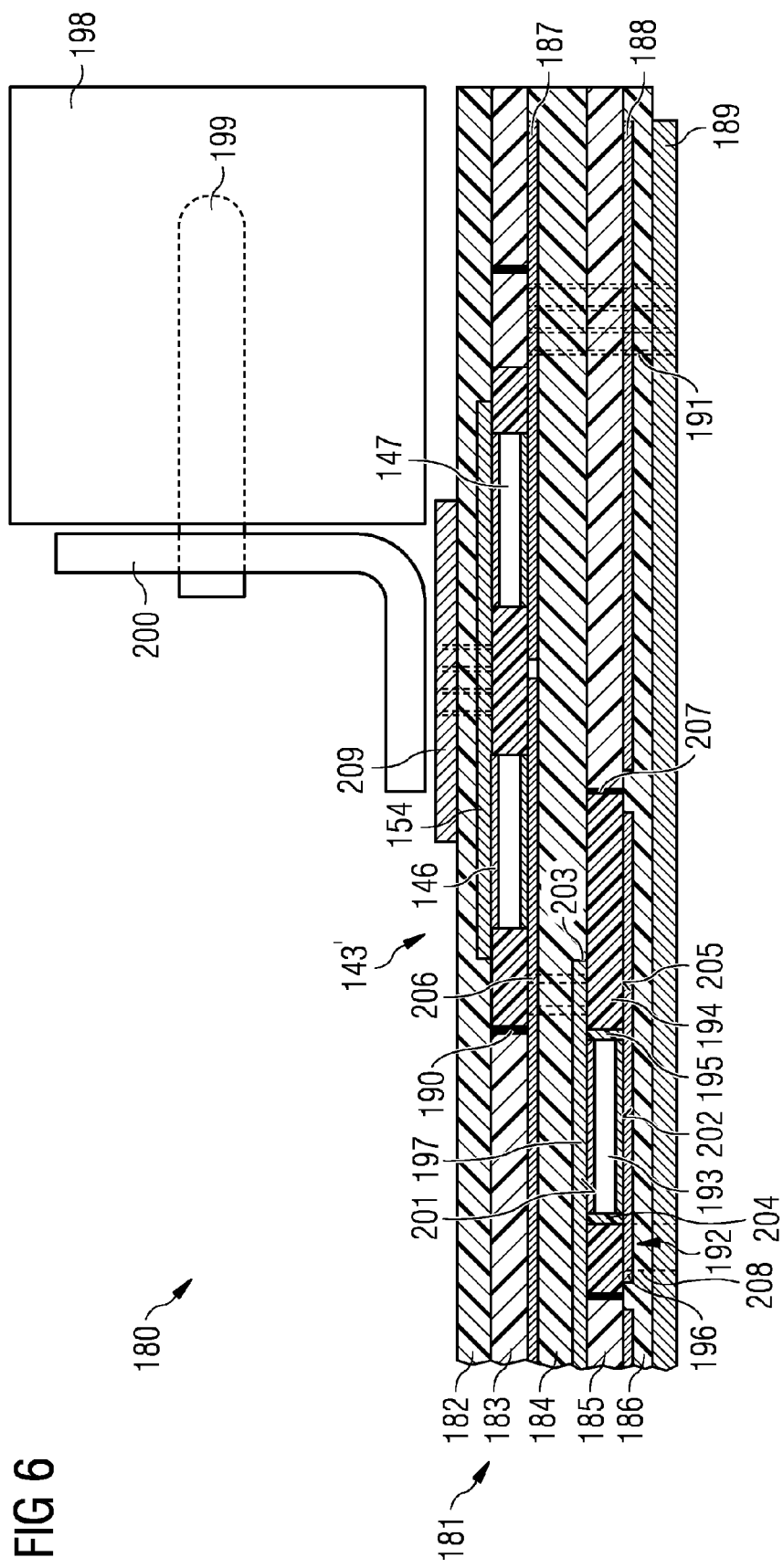
FIG. 6 illustrates a cross-section of a portion of a power supply.

FIG. 6 illustrates a power supply 180 according to an embodiment. The power supply 180 includes a multilayer circuit board 181. In this embodiment, the multilayer circuit board 181 includes five nonconductive core layers 182, 183, 184, 185, 186 and conductive layers 187, 188, 189. However, the circuit board is not limited to this particular number of nonconductive and conductive layers. The power supply 180 includes a submodule 143' including four diodes arranged to provide a bridge rectifier, as in the embodiment illustrated in FIG. 3b.

The submodule 143' is mounted in a cavity 190 positioned in the two core layer 183. The submodule 143 is electrically coupled to the third conductive layer 189 positioned on the lower surface of the fifth core layer 186 by one or more conductive vias 191 extending from the second conductive layer 187 which is electrically coupled to the submodule 143' through nonconductive core layers 184, 185, 186 to the electrically conductive layer 189. The electrically conductive layer 189 may provide a ground plane, for example.

The multilayered circuit board 181 further includes a second submodule 192 which includes a transistor 193 acting as a switch in the primary side circuit. The second submodule 192 includes a non-conductive core layer 194 with a cavity 195 in which the transistor 193 is mounted. The transistor 193 may be mounted in the cavity 195 by means of a retainer 204 which may be an adhesive positioned between the sidewalls defining the cavity 195 and the side faces of the transistor 193.

Conductive connections may be made to the transistor 193 by one or more electrically conductive traces 196 arranged on a first major surface 201 of the transistor 193 and a first major surface 203 of the core layer 194 of the submodule 192. For a vertical transistor which has electrodes on its two opposing major surfaces, a conductive connection may be made to the transistor by a second conductive trace 197 arranged on the second major surface 202 of the transistor 193 and on the second major surface 205 of the core layer 194 of the submodule 192. This arrangement of the conductive traces 196, 197 may be used if the transistor 193 has a height corresponding to the height of the core layer 194, for example. The conductive traces 196, 197 may provide contact pads at their distal end and provide a redistribution structure for the submodule 192.

The second module 192 is mounted in a second cavity 207 positioned in the fourth core layer 185 of the multilayered circuit board 181. The submodule 192 is electrically coupled to the submodule 143 by a plurality of conductive vias 206 extending from the upper conductive trace 197 of the submodule 192 and the lower conductive trace 156 of the module 143. The submodule 192 is electrically coupled to the conductive layer 189 on the lower surface of the circuit board 181 by a plurality of conductive vias 208 which extend from the lower conductive trace 196 of the submodule 192 through the core layer 186 to the conductive layer 189.

In the power supply 180, the transistor 193 is positioned in a different plane to the diodes providing the bridge rectifying circuit. Furthermore, the transistor 193 is positioned in a second submodule 192 which is separate from the first submodule 143'. The second submodule 192 is mounted in a different layer of the multilayer circuit board 181 from the first submodule 143'. The second submodule 192 and/or the transistor 193 may be positioned directly underneath the first submodule 143 so that the first submodule 143' partially or completely overlaps the second submodule 192. A partially or completely overlapping arrangement may be used to save lateral space for the circuit board 181.

In some embodiments, the two submodules may be provided which may be arranged in the same layer of the circuit board. The power supply may also include more than two submodules and may include further components embedded in the circuit board.

The power supply 180 further includes an input port 198 which, in this embodiment, is a socket including one or more conductive pins 199 which are electrically coupled to an internal conductive connector 200 of the power supply 180. The internal conductive connector 200 is electrically coupled to the first module 143 by a conductive contact 209 and a plurality of conductive vias which extend through the nonconductive layer 182. The internal conductive connector 200 is positioned above the first submodule 143'.

In portions of the circuit board 181 not seen in the cross-sectional view of FIG. 6, at least one conductive via is provided which extends through the entire thickness of the circuit board 181 from the upper surface to the lower surface.

The first submodule 143 and the second submodule 192 are arranged proximal to the input port 198 and, in particular, proximal to the metallic parts 199, 200 of the input port 198 such that thermally energy dissipated by the diodes and transistor 193 within the first submodule 143 and the second submodule 192, respectively, is encouraged to be dissipated by way of the metallic parts 199, 200 of the input port 198 outside of the power supply 180. If a further connector, such as a cable, is detachably connected to the input port 198, heat may be dissipated into this connector.

Figure 7:
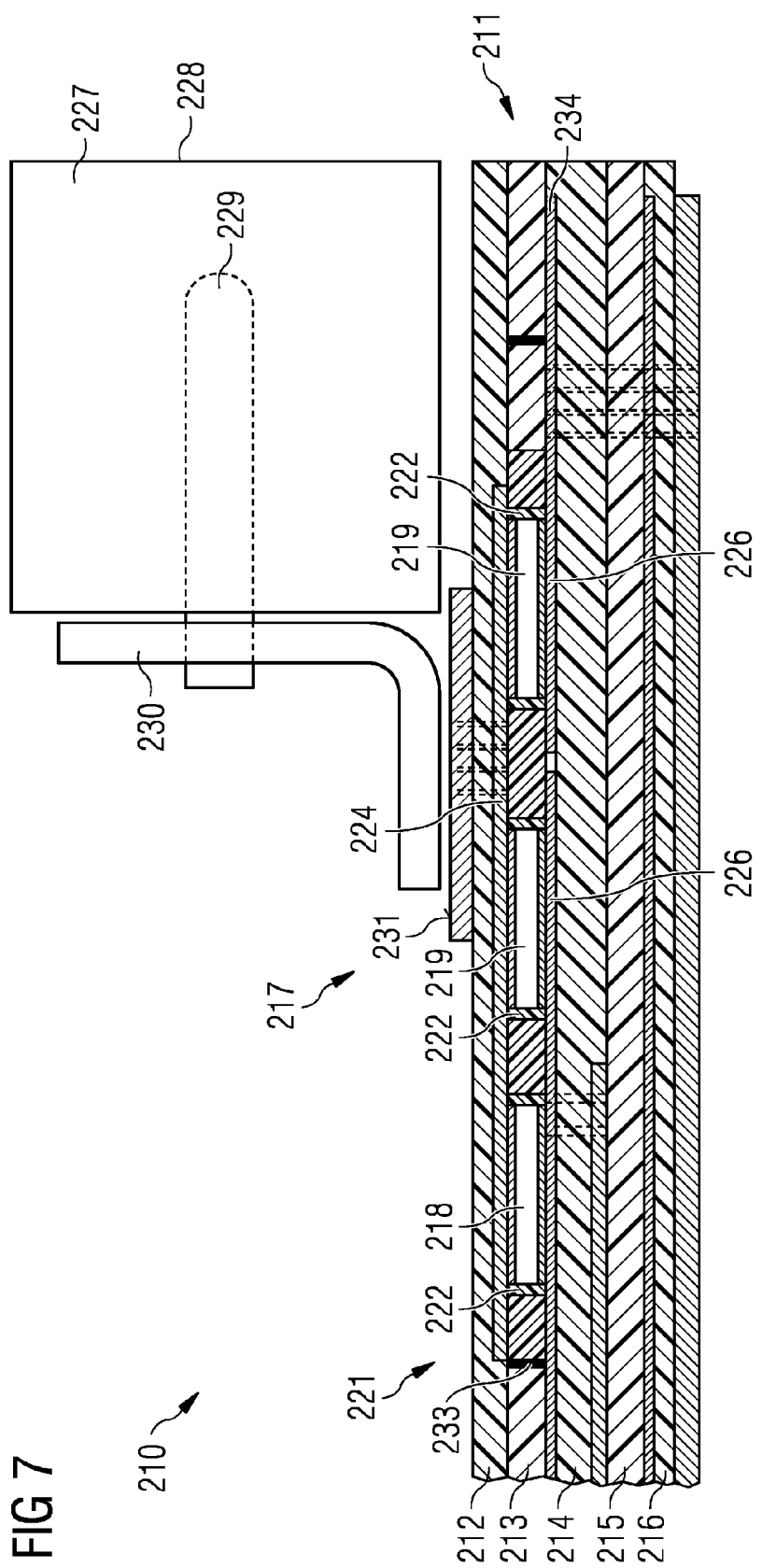
FIG. 7 illustrates a cross-section of a portion of a power supply.

FIG. 7 illustrates a cross-sectional view of a portion of a power supply 210 according to an embodiment. The power supply 210 includes a multilayer circuit board 211 including five core layers 212, 213, 214, 215, 216. FIG. 7 illustrates a portion of the primary side of an AC-DC power converter. The primary side circuit includes a bridge rectifying circuit 217 and a switching transistor 218. The bridge rectifying circuit 217 is provided by four diodes 219 connected in a bridge arrangement, of which two of the diodes 219 are illustrated in the cross-sectional view of FIG. 7. The power supply 210 includes a submodule 221 which not only includes the four diodes 219 providing the bridge rectifying circuit 217 but also includes the switching transistor 218.

The submodule 221 includes five cavities 222, one for each of the diodes 219 and one for the transistor 218. Each of the cavities 222 is arranged in a common core layer 223 of the submodule so that the diodes 219 and switching transistor 218 are coplanar. The submodule 221 further includes a redistribution structure electrically connecting the diodes 219 to form the bridge circuit 217 and to electrically couple the transistor 218 to the bridge circuit 217 in order that the transistor 218 can switch the output from the bridge circuit 217.

The diodes 219 and transistor 218 are vertical devices and each has at least one electrode on its two opposing major surfaces. The submodule 221 includes electrically conductive traces 224 on its upper surface which electrically connect two of the diodes 219, 220 to form a pair and provide a node of the bridge circuit. The opposing side of the diodes 219, 220 is electrically connected to a diode of the other pair of diodes by an electrically conductive trace 226. The transistor 218 is arranged in a source down arrangement and is electrically connected to the diode 219 by the electrically conductive trace 226 so as to switch the output from the bridge circuit 217.

The submodule 221 is mounted in a cavity 233 in core layer 213 of the circuit board 211. The submodule 221 is electrically coupled to the redistribution structure of the multilayer circuit board 211 by electrical connections between the conductive traces 224, 226 of the submodule 221 and conductive traces 234 of the multilayer circuit board 211. For example, the conductive trace 226 of the submodule 221 may be soldered onto a conductive trace 234 of the multilayer circuit board 211.

As in the embodiment illustrated in FIG. 6, the power supply 210 further includes an input port 227 in the form of a socket 228 including at least one conductive pin 229 and an internal conductor 230 which is electrically coupled to the submodule 221 and, in this particular embodiment, the internal connector 230 is mounted on the contact area 232 on the upper surface 231 of the submodule 221.

Figure 8:
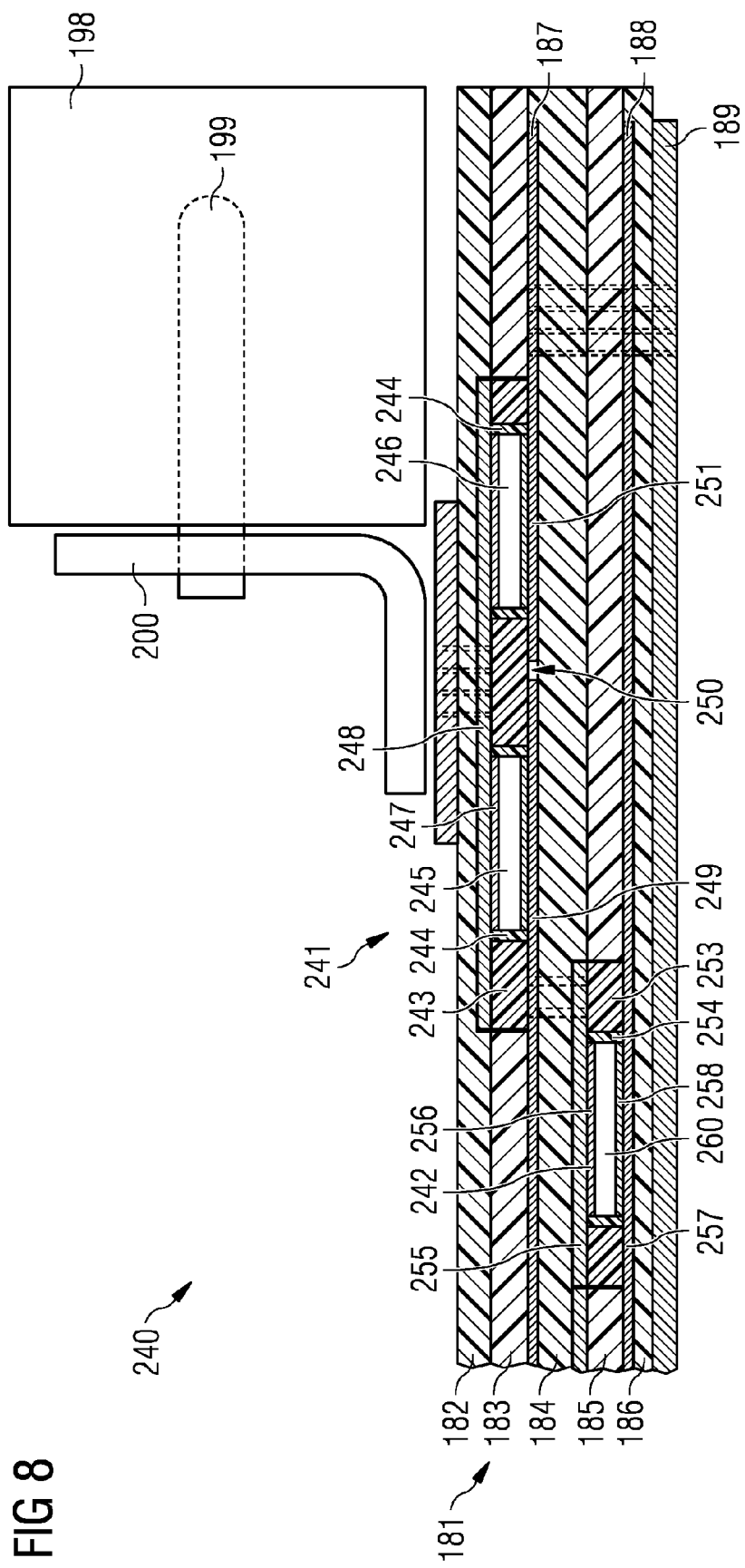
FIG. 8 illustrates a cross-section of a portion of a power supply.

FIG. 8 illustrates a schematic cross-sectional view of a portion of the primary side circuit of a power supply 240 according to an embodiment. The power supply 240 is similar to that of the power supply 180 illustrated in FIG. 6 and includes a multilayer circuit board 181 having the arrangement described in connection with FIG. 6 and an input port 198 with at least one conductive pin 199 and internal connector 200 which is electrically coupled to the circuit board 181. The power supply 240 differs from the power supply 180 illustrated in FIG. 6 in the arrangement of submodules 241, 242.

The primary side circuit includes a first submodule 241 providing a rectifying circuit, in particular a bridge rectifying circuit and a second submodule 242 including a switching transistor 260.

The first submodule 241 includes a single core layer 243 including four cavities 244. A diode is arranged in each cavity. In the cross-sectional view of FIG. 8, two of the diodes 245, 246 are illustrated. The first submodule 243 includes a redistribution structure electrically coupling the diodes to one another in a bridge rectification circuit configuration.

In the portion illustrated in the cross-sectional view of FIG. 8, the upper electrode of diodes 245 is electrically coupled to the electrode of diode 246 by the electrically conductive trace 247 which extends from the electrode on the upper surface of the diode 245 along the upper surface 248 of the core layer 243 to the upper diode of the diode 246 and provides a node of the bridge circuit. The electrode on the lower surface of the diode 245 is electrically connected to a further diode of the bridge rectification circuit by a trace conductive trace 249 positioned on the lower electrode of the diode 245 which extends over the lower surface 250 of the core layer 243. The electrode on the lower surface of the diode 246 is electrically coupled to get a further diode of the bridge rectification circuit by electrically conductive trace 251 positioned on the electrode on the lower surface of the diode 246 and the lower surface 250 of the core layer 243 of the submodule 241.

The first submodule 241 has a height which corresponds to the height of the second core layer 183 of the multilayer circuit board 181. The first submodule 241 is positioned in a cavity the second core layer 183 of the multilayer circuit board 181 and is sandwiched between the first core layer 182 and the second core layer 184. The first submodule 241 is buried within the body of the multilayer circuit board 181.

The second submodule 242 including the switching transistor 243 includes a single core layer 253 and a single cavity 254 in which the switching transistor 243 is positioned. The switching transistor 252 is also vertical device with at least one electrode positioned on the two opposing major surfaces. The second submodule 242 includes at least one conductive trace 255 positioned on the upper surface 256 of the core layer 253 which electrically couples an electrode, for example a drain electrode, on the upper surface of the transistor 252 to an outer contact pad of the submodule 242.

The submodule 242 further includes at least one conductive trace 257 positioned on a lower side 258 of the core layer 253 which electrically couples an electrode, for example a source electrode, on the lower surface of the transistor 252 to contact pad on the lower surface of the second submodule 242. The submodule includes a further conductive trace positioned on the lower side 258 of the core layer 253 which electrically couples a control electrode, for example a gate electrode, on the lower surface of the transistor 243 to contact pad on the lower surface of the second submodule 242.

The electrically conductive traces 255 and 257 provide a redistribution structure for the second submodule 242 and, in particular, from the electrodes of the transistor 260 to contact areas of the second submodule 242 which may be electrically coupled to a further trace of the conductive layer 188 of the multilayer circuit board 181 and further components of the power supply 240, such as the bridge rectifying circuit of the first submodule 241.

The second submodule 242 has a height which corresponds to the height of the fourth core layer 185 and is arranged in a cavity 259 within the fourth core layer 185. The fourth core layer 185 is sandwiched between the third core layer 184 and the fifth core layer 156 so that the third core layer 184 covers the upper side of the submodule 242 and the fifth core layer 186 covers the lower side of the second submodule 242.

In the embodiment illustrated in FIG. 8, the first submodule 241 and the second submodule 242 of the power supply 240 are arranged in differing layers of the multilayer circuit board 181. However, the first submodule 241 and the second submodule 242 may also be arranged in the same core layer.

The first submodule 241 and the second submodule 242 may be arranged have a stacked arrangement in which one submodule is positioned at least partially above the other such that portions of the submodules overlap. However, the first submodule 241 and the second submodule 242 may also be arranged in the multilayer circuit board 181 such that they do not overlap, even if they are positioned in different layers of the circuit board 181.

Figure 9:
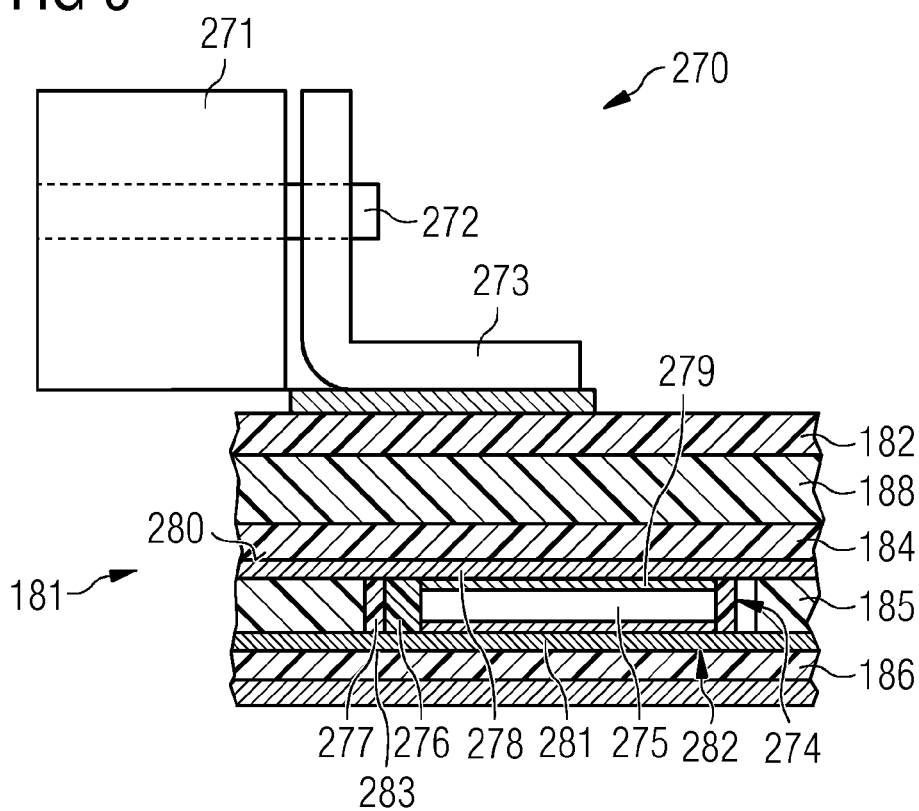
FIG. 9 illustrates a cross-section of a portion of a secondary side circuit of a power supply.

FIG. 9 illustrates a schematic cross-sectional view of a portion of a power supply 270 according to an embodiment. In particular, FIG. 9 illustrates a portion of a secondary side circuit of a power supply including an output port 271 and multilayer circuit board 181 with five nonconductive core layers and three conductive layers and having a general construction as is illustrated in FIG. 6. However, the circuit board is not limited to this particular configuration and may have more or fewer nonconductive core layers and conductive layers.

The output port 271 includes at least one electrically conductive pin 272 and an inner connector 273 electrically coupling the pin 272 to the circuit board 181. The power supply 270 includes a submodule 274 including one or more components of the secondary side circuit of the power supply. In this embodiment, the submodule 274 includes a single core layer 277 and transistor 275 embedded in a cavity 276 in the core layer 277. The submodule 274 further includes a redistribution structure for electrically coupling the transistor 275 to contact pads of the submodule 274 and the submodule 274 to redistribution structure of the multilayer circuit board 181.

The submodule 274 includes at least one conductive trace 279 arranged on its upper surface 280 which electrically couples an electrode on the upper surface of the transistor 275 to a contact pad 278. The submodule 274 further includes a conductive trace 281 on its lower surface 282 which electrically couples an electrode on the lower surface of the transistor 275 to a contact pad 283 positioned on the lower surface 282 of the submodule 274.

The submodule 274 has a height which corresponds to the height of the fourth core layer 185 of the circuit board 181. The submodule 274 is arranged in a cavity 284 positioned in the fourth core layer 185. The submodule 274 is embedded entirely within the body of the circuit board 181 and is laterally positioned so that it is proximal to the output port 271 such that at least a portion of the heat generated by the transistor 275 may be thermally dissipated by way of the output port 271 and, in particular, by way of the conductive connector 273 and conductive pin 272.

The heat may be thermally dissipated into a further connector coupled to the output port 271. The output port may be a socket, such as a USB socket, or a Firewire socket or Thunderbolt socket. The output port 271 may have other forms such as a cable or a pin.

The first submodule 274 may be positioned directly underneath at least a portion of the output port 271, for example, partially underneath the connector 273.

The secondary side circuit of the power supply 270 may include a DC-DC converter. One or more of the further components of the secondary side may be embedded within the circuit board 181.

The arrangement shown for the secondary side 183 and the output port 271 may be used in conjunction with the arrangement illustrated in FIGS. 2, 3 and 6 to 8 for the primary side of an AC/DC converter.

However, the arrangement of the primary side circuit and the secondary side circuit may differ from those illustrated. For example, the rectifying circuit may have a configuration other than a bridge rectifying circuit and may have configurations other than those including four diodes. Similarly, the secondary side circuit is not limited to the configurations illustrated in FIGS. 1, 4, 5 and 9 and may include other configurations including components such as a diode and/or a transistor which may be buried within a core layer of the circuit board or mounted on the surface circuit board of the power supply.

Figure 10:
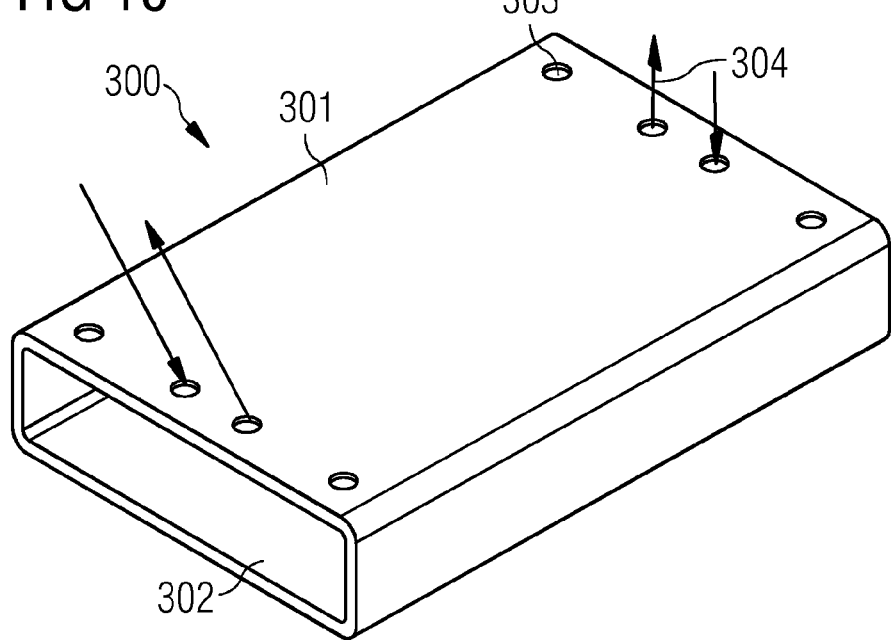
FIG. 10 illustrates a perspective view of a housing for a power supply.

FIG. 10 illustrates a housing 300 suitable for use with a power supply. The power supply may have one or more of the features of the embodiments described in connection with FIGS. 1 to 9. However, the power supply may have any configuration.

The housing 300 includes a wall 301 defining a volume 302 having dimensions suitable for receiving a power supply including an input port, output port and a circuit board supporting the components of the power supply, for example components for providing an AC/DC converter.

In the embodiment illustrated in FIG. 10, the wall 301 defines a volume 302 having a generally rectangular cross-section. However, the wall 301 may define other types of cross-section. The housing 300 further includes at least one channel 303 which extends through the thickness of the wall 301 so as to enable heat generated within the volume 302 of the housing 300 be dissipated by way of the channel 303 into the environment external to the housing 300, as a schematically indicated in FIG. 10 by the arrows 304. In particular, the housing may include a plurality of channels 303. The channels 303 may be arranged only at positions proximal to heat generating components of the power supply or may be distributed throughout the housing 300.

Figure 11:
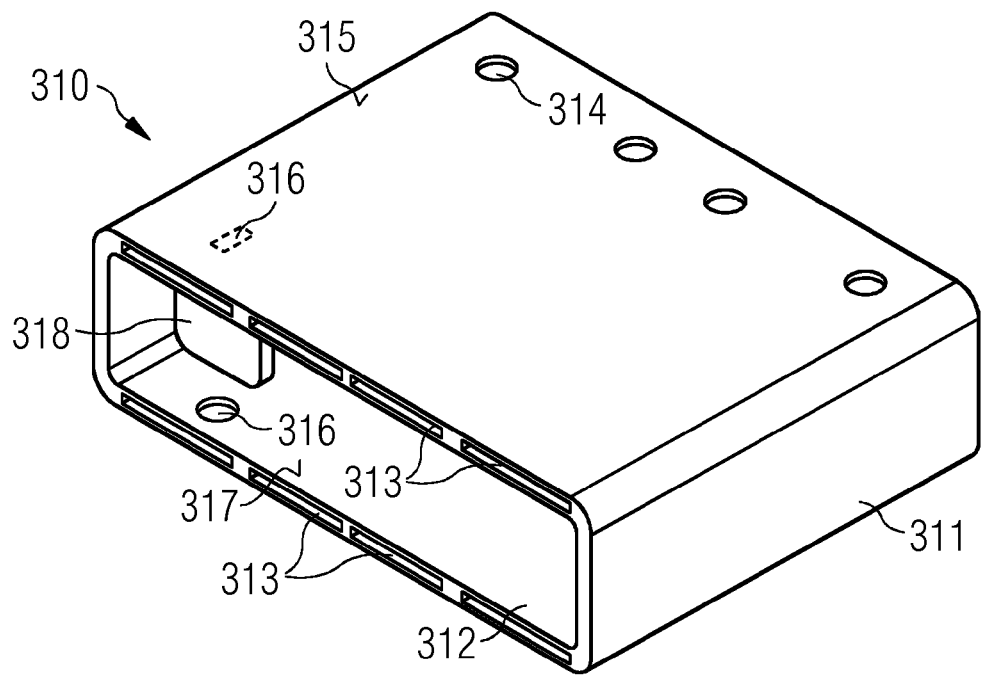
FIG. 11 illustrates a perspective view of a cross-section of a housing for a power supply.

FIG. 11 illustrates a perspective cross-sectional view of an embodiment of a housing 310 for a power supply. In the housing 310, the wall 311 defining the volume 312 for receiving the power supply is provided by a double wall. At least one channel 313 extends within the thickness of the double wall and includes a through hole 314 from the channel 313 to the outer surface 315 of the housing 310 and a through hole 316 extending from the channel 313 to the inner surface 317 of the volume 312. Heat generated within the volume 312 may be dissipated from the housing 310 by an airflow through hole 316 along the channel 313 and out of the through hole 314 positioned in the outer surface 315 of the housing 310.

The housing 310 may further include one or more baffles 318 positioned within the volume 312 of the housing. The one or more baffles 318 may be arranged on the power supply or protrude from the inner surface of the wall 311. The baffles 318 may be arranged around heat generating components of the power supply module and discourage heat from being thermally dissipated within the volume 312 of the housing 310. The heat is encouraged by a thermal siphoning mechanism to be dissipated from the housing 310 through the paths created by the through hole 316, channels 313 positioned in the double wall 311 and through holes 314.

Thermal siphoning is a term used to describe a flow of air produced by a temperature gradient over a path. In the embodiment illustrated in FIG. 11, a hot spot is created around the heat generating component positioned near the through hole 316 in the inner surface 317 due to the position of the baffle 318. The temperature at the through hole 314 in the outer surface 315 of the housing 310 may be lower, thus creating a temperature gradient and heat siphoning path from through hole 316 to through hole 314. The housing 300 may include one or more of heat siphoning paths.

Figure 12:
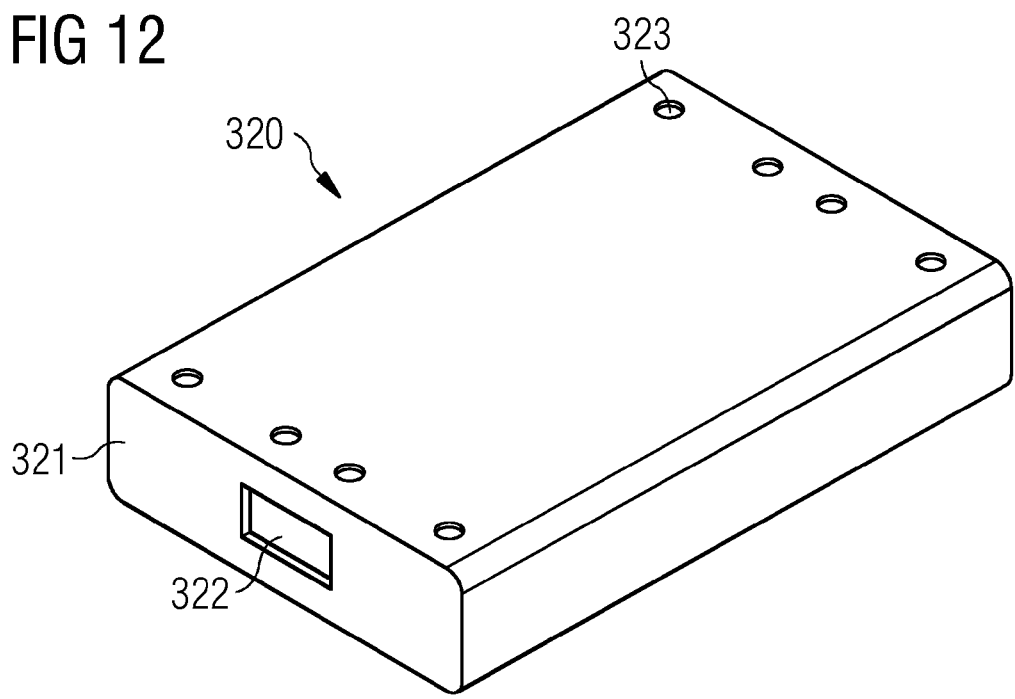
FIG. 12 illustrates a perspective view of a side face of a housing for a power supply.

FIG. 12 illustrates a perspective view of a housing 320 which may have a single wall construction as disclosed in connection with FIG. 10 or a double wall construction is disclosed in connection with FIG. 11. The housing has through holes 323 to allow heat generated within the casing to be dissipated by an air flow from the interior through the through-holes 323 to the environment. The housing 320 includes a side face 321 including an opening 322 with dimensions suitable for receiving the output port of the power supply to be mounted in the housing 320. For example, the output port may be attached to the circuit board of the power supply.

Figure 13:
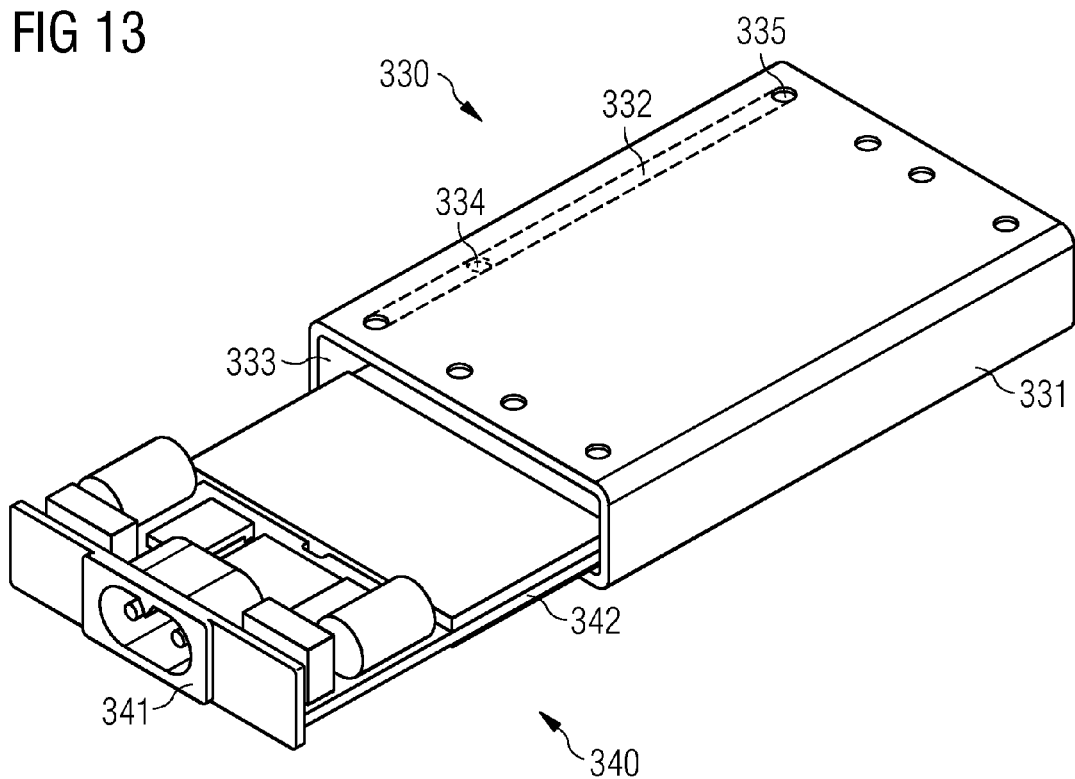
FIG. 13 illustrates a housing and a power supply.

FIG. 13 illustrates a schematic perspective view of a housing 330 which may have a configuration as described in connection with one of FIGS. 10 to 12 and a partially inserted power supply 340 module including an input port 341, a circuit board 342 and a plurality of components providing the power supply. The housing 330 includes a double wall 331 including at least one channel 332 arranged within the double wall which is open to the interior 333 of the housing 300 and to the exterior of the housing 300 by through-holes 334, 335.

In the embodiment illustrated in FIG. 13, the power supply 340 provides an AC-DC converter including a planar transformer and embedded rectifying and switching components embedded within the circuit board 342. However, the housing 330 may be used for power supplies in which the rectifying and switching components and the transformer not mounted within the circuit board, but are mounted solely on the circuit board.

Figure 14:
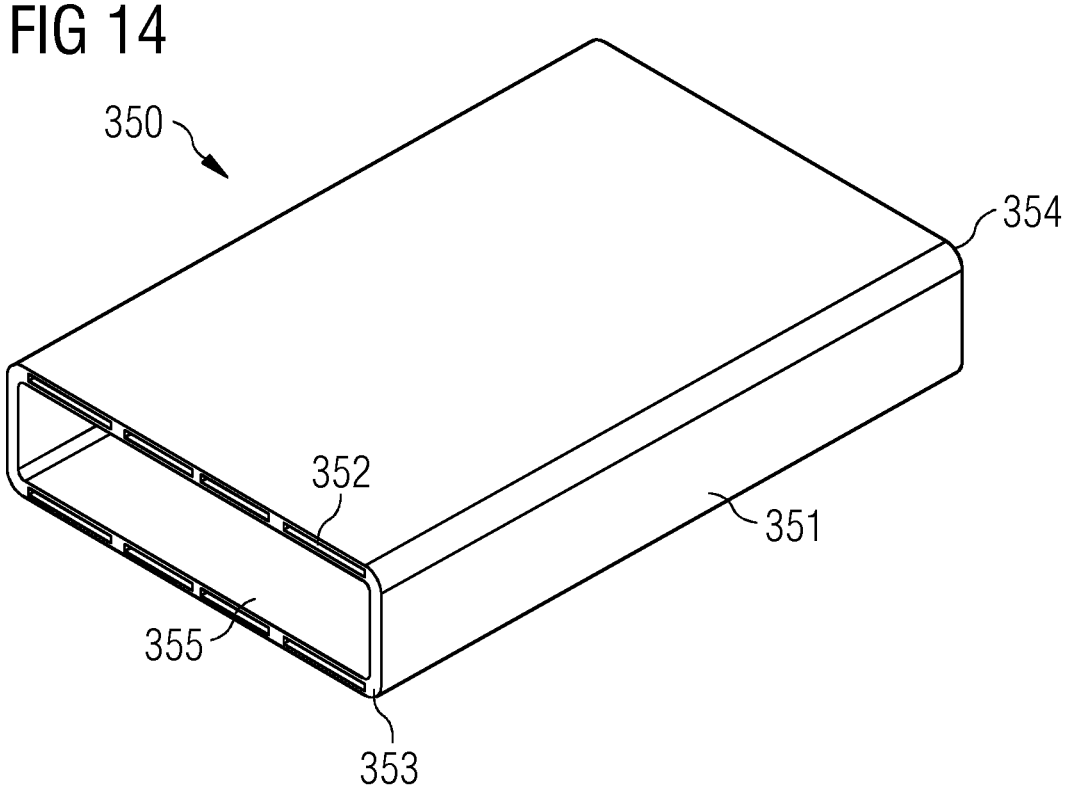
FIG. 14 illustrates a perspective view of a housing for a power supply.

FIG. 14 illustrates a perspective view of a housing 350 which is defined by a wall 351 providing a housing 350 with a generally rectangular cross-section. The housing 350 includes a plurality of channels 352 positioned at intervals within the wall 351. The channels 352 extend over the entire length of the housing 350 and are open to the atmosphere at a first end face 353 and opposing second end face 354 of the housing 350. The first end face 353 includes a rectangular opening 355 bounded by the wall 351 into which a power supply module, such as that illustrated in FIG. 13, may be inserted. The channels 352 are positioned in the portions of the wall 351 defining the longer sides of the rectangular cross-section. However, channels may also be positioned in the shorter sides defining the rectangular cross-section.

The channels 352 each have a general rectangular cross-section and each extend form the first end face 353 to the second end face 354 to provide a plurality of separate longitudinal channels. However, the channels are not limited to this cross-section and may have other cross-sectional forms, such as square, circular or oval.

Figure 15:
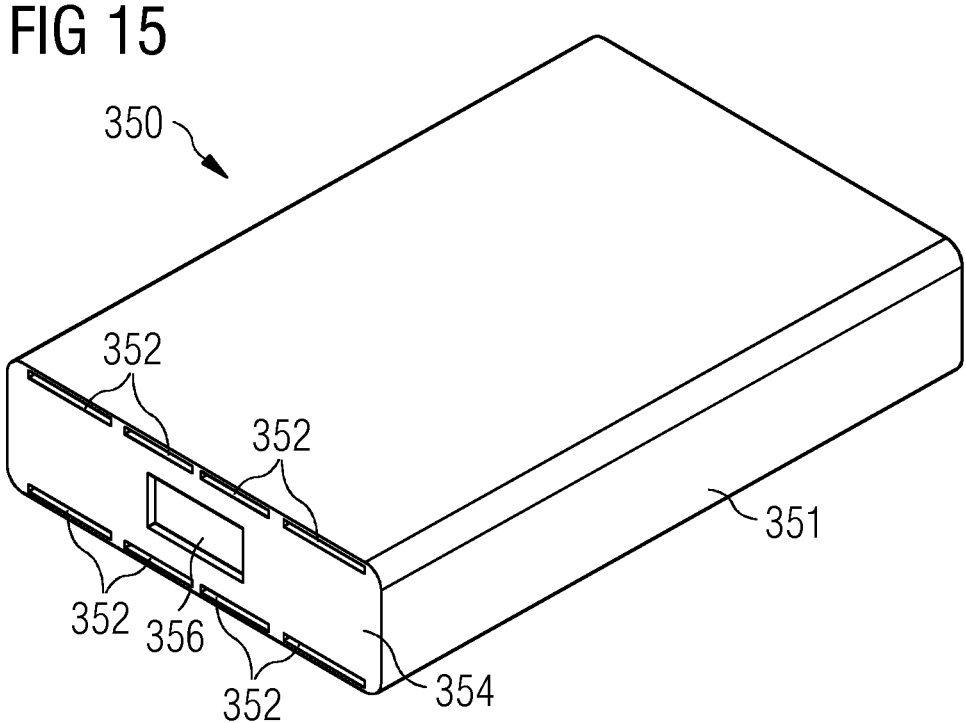
FIG. 15 illustrates a perspective view of a housing for a power supply.

FIG. 15 illustrates a perspective view of the housing 350 and in particular illustrates the second end face 354. The channels 352 have openings in the end face 354. Additionally, the end face 354 includes a further opening 356 which extend throughout the thickness of the end face 354 into the inner volume bounded by the wall 351. The opening 356 is configured to receive an output port mounted on a power supply positioned within the housing 350.

FIG. 16 illustrates a perspective cross-sectional view of the housing 350 illustrating that the channels 352 are positioned within the thickness of the wall 350 and are not in fluid communication with the inner surface 357 or with the outer surface 358 of the wall 351 of the housing 350. The channels 352 are in fluid communication with the atmosphere only through the side faces 353 and 354 of the housing 350.

Whilst the cross-section of the housing 350 has been described as a rectangle, it is to be understood that the corners of the rectangle, both on the inner surface 357 and the outer surface 358 may be rounded.

FIG. 17 illustrates a perspective view of a cross-section of a housing 360. The housing 360 in is defined by a wall 361 defining a volume with a rectangular cross-section. The housing 360 further includes a plurality of channels 362 positioned within the wall 361. The shape of the channels 362 within the wall 361 is illustrated in FIG. 17 with dotted lines.

Four openings 365 are positioned in the upper portion 366 of the wall 361 and a further four openings 365 are positioned in the lower portion 367 of the wall 361 at the end face 363 and at the cross-sectional surface 364. However, two adjacent openings 365 of two separate channels 362 merge into one another to form a single channel 368 which has two openings 365 at the end face 363.

The upper portion 366 includes two of these arrangements which are separate from one another. The lower surface 367 also includes two of these arrangements which are separate from one another. The end face 363 also includes an opening 369 to the internal volume 370 defined by the housing 360 for accommodating an output port of a power supply inserted in the volume 370. The channels 362 are not open to the inner volume 370 of the housing 360.

The open ended channels 362 extending from one end face to the other end face of the housing 360 may also merge into one another to provide different forms. Three or even more channels may merge into one another and/or diverge from a single channel to form a plurality of separate channel portions.

These arrangements of merging and diverging channels may be used to encourage heat dissipation from heat generating components within the volume 370 of the housing 360 by thermal siphoning effects. For example, the channels may be arranged to converge or diverged depending on the position of the heat generating components within the volume 370 of the housing 360 in order to dissipate heat from a hotspot within the volume 370 out of the housing 360 by an airflow encouraged by a thermal gradient between the heat generating component and the openings 365 at the end faces of the housing 360.

The housing of the embodiments illustrated in FIGS. 10 to 17 is illustrated as a single piece. However, the housing may also include two or more pieces which can be attached to one another. For example, the housing may have an upper portion and a lower portion which enclose the power supply module when attached to one another. This arrangement may be used if baffles protrude from the inner surface of the housing.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power supply comprising:
   a plurality of electronic components comprising one or more of a rectifier and a switching transistor;
   an input port configured to receive electrical energy from a power source; and
   a circuit board comprising a cavity, wherein at least one of the rectifier and the switching transistor is embedded in the cavity, and wherein the cavity is arranged proximal to the input port such that least a portion of thermal energy generated by one or more of the rectifier and the switching transistor is dissipated from the power supply by way of the input port.

2. The power supply of claim 1, wherein the at least a portion of thermal energy dissipated from the power supply by way of the input port is transferred from the power supply by way of at least one connector that couples the input port to the power source.

3. The power supply of claim 2 wherein the least one connector comprises a cable.

4. The power supply of claim 2, wherein the at least a portion of the thermal energy dissipated from the power supply by way of the at least one connector is further dissipated into the power source.

5. The power supply according to claim 1, wherein the input port is electrically coupled to one or more of the rectifier and the switching transistor.

6. The power supply according to claim 1, wherein at least a portion of the cavity is positioned beneath the input port.

7. The power supply according to claim 1, wherein the input port is electrically coupled to the rectifier by at least one conductive trace of the circuit board.

8. The power supply according to claim 1, wherein the at least one switching transistor is embedded within the circuit board.

9. The power supply according to claim 1, wherein the rectifier comprises a plurality of switches configured in a bridge circuit and embedded in the circuit board.

10. The power supply according to claim 1, wherein the input port comprises one of a socket, a lead and a plug.

11. The supply according to claim 1, further comprising a transformer.

12. The power supply according to claim 11, wherein the transformer comprises a core and at least the core is embedded in the circuit board.

13. The power supply of claim 12, wherein the transformer is embedded in a portion of the circuit board that is arranged such that one or more of the rectifier and the switching transistor is positioned between the input port and the transformer.

14. The power supply according to claim 1, further comprising an output port.

15. The power supply according to claim 14, further comprising at least one further switching transistor arranged proximal to the output port such that at least a portion of heat generated by the at least one further switching transistor is dissipated from the power supply by way of the output port.

16. The power supply according to claim 15, wherein at least a portion of the at least one further switching transistor is embedded in the circuit board.

17. The power supply according to claim 14, wherein the output port comprises one of a socket, a lead and a plug.

18. A method, comprising:
    receiving, at an input port of a power supply, electrical energy from a power source;
    supplying the received electrical energy to one or more of a rectifier and a switching transistor, wherein one or more of the rectifier and the switching transistor is embedded in a cavity, and wherein the cavity is arranged proximal to the input port;
    dissipating at least a portion of thermal energy generated by one or more of the rectifier and the switching transistor from the power supply by way of the input port.

19. The method according to claim 18, wherein the at least a portion of thermal energy dissipated from the power supply by way of the input port is transferred from the power supply by way of at least one connector that couples the input port to the power source.

20. A power supply, comprising:
    means for receiving, at an input port of a power supply, electrical energy from a power source;
    means for supplying the received electrical energy to one or more of a rectifier and a switching transistor, wherein one or more of the rectifier and the switching transistor is embedded in a cavity, and wherein the cavity is arranged proximal to the input port;
    means for dissipating at least a portion of thermal energy generated by one or more of the rectifier and the switching transistor from the power supply by way of the input port.

21. The power supply of claim 1, wherein the at least a portion of thermal energy is dissipated outside of the power supply.

* * * * *

UNITED STATES PATENT AND TRADEMARK OFFICE
CERTIFICATE OF CORRECTION

PATENT NO. : 9,642,289 B2  
APPLICATION NO. : 14/031720  
DATED : May 2, 2017  
INVENTOR(S) : M. Standing Page 1 of 1

It is certified that error appears in the above-identified patent and that said Letters Patent is hereby corrected as shown below:

In the Claims

Column 17, Line 48 (Claim 1, Line 9) please change "that least" to -- that at least --
Column 17, Line 57 (Claim 3, Line 1) please change "the least" to -- the at least --
Column 18, Line 12 (Claim 11, Line 1) please change "The supply" to -- The power supply --

Signed and Sealed this
Fourth Day of July, 2017

Joseph Matal
*Performing the Functions and Duties of the*
*Under Secretary of Commerce for Intellectual Property and*
*Director of the United States Patent and Trademark Office*